(12) United States Patent
Goergen et al.

(10) Patent No.: US 10,698,041 B2
(45) Date of Patent: Jun. 30, 2020

(54) VERIFICATION OF CABLE APPLICATION AND REDUCED LOAD CABLE REMOVAL IN POWER OVER COMMUNICATIONS SYSTEMS

(71) Applicant: CISCO TECHNOLOGY, INC., San Jose, CA (US)

(72) Inventors: Joel Richard Goergen, Soulsbyville, CA (US); Chad M. Jones, Doylestown, OH (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/355,166

(22) Filed: Mar. 15, 2019

(65) Prior Publication Data

US 2019/0277900 A1    Sep. 12, 2019

Related U.S. Application Data

(62) Division of application No. 16/020,917, filed on Jun. 27, 2018, now Pat. No. 10,281,513.

(60) Provisional application No. 62/641,183, filed on Mar. 9, 2018.

(51) Int. Cl.
```
G08B 1/08       (2006.01)
G01R 31/67      (2020.01)
H04L 12/10      (2006.01)
H04L 12/40      (2006.01)
```
(52) U.S. Cl.
CPC .............. *G01R 31/67* (2020.01); *H04L 12/10* (2013.01); *H04L 12/40045* (2013.01)

(58) Field of Classification Search
CPC .............................. G01R 31/041; H04L 12/10

USPC ........ 340/538, 310.01, 310.02, 657; 713/300, 713/321, 340
See application file for complete search history.

(56) References Cited

U.S. PATENT DOCUMENTS

| | | | |
|---|---|---|---|
| 3,335,324 A | 8/1967 | Buckeridge | |
| 4,614,924 A * | 9/1986 | Kamitz | H04B 15/005 333/12 |
| 4,811,187 A | 3/1989 | Nakajima | |
| 5,652,893 A | 7/1997 | Ben-Meir | |

(Continued)

FOREIGN PATENT DOCUMENTS

| CN | 201689347 U | 12/2010 |
|---|---|---|
| CN | 205544597 | 8/2016 |

(Continued)

OTHER PUBLICATIONS

"Network Remote Power Using Packet Energy Transfer", Eaves et al., www.voltserver.com, Sep. 2012.

(Continued)

*Primary Examiner* — Tai T Nguyen
(74) *Attorney, Agent, or Firm* — Cindy Kaplan (57) ABSTRACT

In one embodiment, an apparatus includes a port for receiving a plug connected to one end of a cable with another plug connected to an opposite end of the cable for use in a Power over Ethernet system delivering power at a level exceeding 100 watts, an online removal button on a face of the port for use in indicating an intent to remove the plug from the port, and an online removal module for detecting activation of the online removal button and reducing power on the cable to at least 90 watts to prevent damage during removal of the cable.

20 Claims, 7 Drawing Sheets

(56) References Cited

U.S. PATENT DOCUMENTS

| | | | |
|---|---|---|---|
| 6,008,631 A | 12/1999 | Johari | |
| 6,220,955 B1 | 4/2001 | Posa | |
| 6,259,745 B1 | 7/2001 | Chan | |
| 6,636,538 B1 | 10/2003 | Stephens | |
| 6,685,364 B1 | 2/2004 | Brezina | |
| 6,826,368 B1 | 11/2004 | Koren | |
| 6,855,881 B2 | 2/2005 | Khoshnood | |
| 6,860,004 B2 | 3/2005 | Hirano | |
| 7,325,150 B2 | 1/2008 | Lehr | |
| 7,490,996 B2 | 2/2009 | Sommer | |
| 7,492,059 B2 | 2/2009 | Peker | |
| 7,509,505 B2 | 3/2009 | Randall | |
| 7,583,703 B2 | 9/2009 | Bowser | |
| 7,589,435 B2 | 9/2009 | Metsker | |
| 7,593,747 B1 | 9/2009 | Karam | |
| 7,603,570 B2 | 10/2009 | Schindler | |
| 7,616,465 B1 | 11/2009 | Vinciarelli | |
| 7,813,646 B2 | 10/2010 | Furey | |
| 7,835,389 B2 | 11/2010 | Yu | |
| 7,854,634 B2 | 12/2010 | Filipon | |
| 7,881,072 B2 | 2/2011 | DiBene | |
| 7,915,761 B1 | 3/2011 | Jones | |
| 7,921,307 B2 | 4/2011 | Karam | |
| 7,924,579 B2 | 4/2011 | Arduini | |
| 7,940,787 B2 | 5/2011 | Karam | |
| 7,973,538 B2 | 7/2011 | Karam | |
| 8,020,043 B2 | 9/2011 | Karam | |
| 8,037,324 B2 | 10/2011 | Hussain | |
| 8,081,589 B1 | 12/2011 | Gilbrech | |
| 8,184,525 B2 | 5/2012 | Karam | |
| 8,276,397 B1 | 10/2012 | Carlson | |
| 8,279,883 B2 | 10/2012 | Diab | |
| 8,319,627 B2 | 11/2012 | Chan | |
| 8,345,439 B1 | 1/2013 | Goergen | |
| 8,350,538 B2 | 1/2013 | Cuk | |
| 8,700,923 B2 | 4/2014 | Fung | |
| 8,712,324 B2 | 4/2014 | Corbridge | |
| 8,750,710 B1 | 6/2014 | Hirt | |
| 8,781,637 B2 | 7/2014 | Eaves | |
| 8,787,775 B2 | 7/2014 | Earnshaw | |
| 8,829,917 B1 | 9/2014 | Lo | |
| 8,836,228 B2 | 9/2014 | Xu | |
| 8,842,430 B2 | 9/2014 | Hellriegel | |
| 8,849,471 B2 | 9/2014 | Daniel | |
| 8,966,747 B2 | 3/2015 | Vinciarelli | |
| 9,019,895 B2 | 4/2015 | Li | |
| 9,024,473 B2 | 5/2015 | Huff | |
| 9,184,795 B2 | 11/2015 | Eaves | |
| 9,189,036 B2 | 11/2015 | Ghoshal | |
| 9,189,043 B2 | 11/2015 | Vorenkamp | |
| 9,273,906 B2 | 3/2016 | Goth | |
| 9,319,101 B2 | 4/2016 | Lontka | |
| 9,321,362 B2 | 4/2016 | Woo | |
| 9,373,963 B2 | 6/2016 | Kuznelsov | |
| 9,419,436 B2 | 8/2016 | Eaves | |
| 9,510,479 B2 | 11/2016 | Vos | |
| 9,531,551 B2 | 12/2016 | Balasubramanian | |
| 9,618,714 B2 | 4/2017 | Murray | |
| 9,590,811 B2 | 5/2017 | Dawson | |
| 9,665,148 B2 | 5/2017 | Hamdi | |
| 9,693,244 B2 | 6/2017 | Maruhashi | |
| 9,734,940 B1 | 8/2017 | McNutt | |
| 9,853,689 B2 | 12/2017 | Eaves | |
| 9,874,930 B2 | 1/2018 | Vavilala | |
| 9,882,656 B2 | 1/2018 | Sipes, Jr. | |
| 9,893,521 B2 | 2/2018 | Lowe | |
| 9,948,198 B2 | 4/2018 | Imai | |
| 9,979,370 B2 | 5/2018 | Xu | |
| 9,985,600 B2 | 5/2018 | Xu | |
| 10,007,628 B2 | 6/2018 | Pitigoi-Aron | |
| 10,028,417 B2 | 7/2018 | Schmidtke | |
| 10,128,764 B1 | 11/2018 | Vinciarelli | |
| 10,248,178 B2 | 4/2019 | Brooks | |
| 10,439,432 B2 | 10/2019 | Eckhardt | |
| 2001/0024373 A1 | 9/2001 | Cuk | |
| 2002/0126967 A1 | 9/2002 | Panak | |
| 2004/0000816 A1 | 1/2004 | Khoshnood | |
| 2004/0033076 A1 | 2/2004 | Song | |
| 2004/0043651 A1 | 3/2004 | Bain | |
| 2004/0073703 A1 | 4/2004 | Boucher | |
| 2005/0197018 A1 | 9/2005 | Lord | |
| 2005/0268120 A1 | 12/2005 | Schindler | |
| 2006/0202109 A1 | 9/2006 | Delcher | |
| 2006/0209875 A1 | 9/2006 | Lum | |
| 2007/0103168 A1 | 5/2007 | Batten | |
| 2007/0236853 A1 | 10/2007 | Crawley | |
| 2007/0263675 A1 | 11/2007 | Lum | |
| 2007/0284946 A1 | 12/2007 | Robbins | |
| 2007/0288125 A1 | 12/2007 | Quaratiello | |
| 2008/0229120 A1 | 9/2008 | Diab | |
| 2008/0310067 A1 | 12/2008 | Diab | |
| 2010/0077239 A1 | 3/2010 | Diab | |
| 2010/0117808 A1 | 5/2010 | Karam | |
| 2010/0171602 A1 | 7/2010 | Kabbara | |
| 2010/0190384 A1 | 7/2010 | Lanni | |
| 2010/0237846 A1 | 9/2010 | Vetteth | |
| 2010/0290190 A1 | 11/2010 | Chester | |
| 2011/0004773 A1* | 1/2011 | Hussain | G06F 1/266 713/300 |
| 2011/0290497 A1 | 1/2011 | Stenevik | |
| 2011/0083824 A1 | 4/2011 | Rogers | |
| 2011/0228578 A1 | 9/2011 | Serpa | |
| 2011/0266867 A1 | 11/2011 | Schindler | |
| 2012/0064745 A1 | 3/2012 | Ottliczky | |
| 2012/0170927 A1 | 7/2012 | Huang | |
| 2012/0201089 A1 | 8/2012 | Barth | |
| 2012/0231654 A1 | 9/2012 | Conrad | |
| 2012/0317426 A1 | 12/2012 | Hunter, Jr. | |
| 2012/0319468 A1 | 12/2012 | Schneider | |
| 2013/0077923 A1 | 3/2013 | Weem | |
| 2013/0079633 A1 | 3/2013 | Weem | |
| 2013/0103220 A1 | 4/2013 | Eaves | |
| 2013/0249292 A1 | 9/2013 | Blackwell, Jr. | |
| 2013/0272721 A1 | 10/2013 | Van Veen | |
| 2014/0111180 A1 | 4/2014 | Vladan | |
| 2014/0129850 A1 | 5/2014 | Paul | |
| 2014/0258742 A1 | 9/2014 | Chien | |
| 2014/0265550 A1 | 9/2014 | Milligan | |
| 2014/0372773 A1 | 12/2014 | Heath | |
| 2015/0078740 A1 | 3/2015 | Sipes, Jr. | |
| 2015/0106539 A1 | 4/2015 | Leinonen | |
| 2015/0115741 A1 | 4/2015 | Dawson | |
| 2015/0215001 A1 | 7/2015 | Eaves | |
| 2015/0215131 A1 | 7/2015 | Paul | |
| 2015/0333918 A1 | 11/2015 | White, III | |
| 2015/0340818 A1* | 11/2015 | Scherer | H01R 13/641 307/125 |
| 2016/0020911 A1 | 1/2016 | Sipes, Jr. | |
| 2016/0064938 A1 | 3/2016 | Balasubramanian | |
| 2016/0111877 A1 | 4/2016 | Eaves | |
| 2016/0118784 A1 | 4/2016 | Saxena | |
| 2016/0133355 A1 | 5/2016 | Glew | |
| 2016/0134331 A1 | 5/2016 | Eaves | |
| 2016/0142217 A1 | 5/2016 | Gardner | |
| 2016/0197600 A1 | 7/2016 | Kuznetsov | |
| 2016/0365967 A1 | 7/2016 | Tu | |
| 2016/0241148 A1 | 8/2016 | Kizilyalli | |
| 2016/0262288 A1 | 9/2016 | Chainer | |
| 2016/0273722 A1 | 9/2016 | Crenshaw | |
| 2016/0291663 A1* | 10/2016 | Sun | G06F 1/266 |
| 2016/0294500 A1 | 10/2016 | Chawgo | |
| 2016/0308683 A1 | 10/2016 | Pischl | |
| 2016/0352535 A1 | 12/2016 | Hiscock | |
| 2017/0041152 A1 | 2/2017 | Sheffield | |
| 2017/0041153 A1 | 2/2017 | Picard | |
| 2017/0054296 A1 | 2/2017 | Daniel | |
| 2017/0110871 A1 | 4/2017 | Foster | |
| 2017/0123466 A1 | 5/2017 | Carnevale | |
| 2017/0146260 A1 | 5/2017 | Ribbich | |
| 2017/0155517 A1 | 6/2017 | Cao | |
| 2017/0155518 A1 | 6/2017 | Yang | |
| 2017/0164525 A1 | 6/2017 | Chapel | |
| 2017/0214236 A1 | 7/2017 | Eaves | |
| 2017/0229886 A1 | 8/2017 | Eaves | |

(56) References Cited

U.S. PATENT DOCUMENTS

| | | |
|---|---|---|
| 2017/0234738 A1 | 8/2017 | Ross |
| 2017/0248976 A1 | 8/2017 | Moller |
| 2017/0325320 A1 | 11/2017 | Wendt |
| 2018/0024964 A1 | 1/2018 | Mao |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello |
| 2018/0102604 A1 | 4/2018 | Keith |
| 2018/0123360 A1 | 5/2018 | Eaves |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec |
| 2019/0267804 A1 | 8/2019 | Matan |
| 2019/0280895 A1 | 9/2019 | Mather |

FOREIGN PATENT DOCUMENTS

| | | |
|---|---|---|
| EP | 1936861 A1 | 6/2008 |
| EP | 2120443 A1 | 11/2009 |
| EP | 2693688 A1 | 2/2014 |
| WO | WO199316407 A1 | 8/1993 |
| WO | WO2010053542 | 5/2010 |
| WO | WO2017054030 | 4/2017 |
| WO | WO2017167926 A1 | 10/2017 |
| WO | WO2018017544 A1 | 1/2018 |
| WO | WO2019023731 A1 | 2/2019 |

OTHER PUBLICATIONS

Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.

Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.

Yencheck, Thermal Modeling of Portable Power Cables, 1993.

Zhang, Machine Learning-Based Temperature Prediction for Runtime Thermal Management across System Components, Mar. 2016.

Dynamic Thermal Rating of Substation Terminal Equipment by Rambabu Adapa, 2004.

Chen, Real-Time Termperature Estimation for Power MOSEFETs Conidering Thermal Aging Effects:, IEEE Trnasactions on Device and Materials Reliability, vol. 14, No. 1, Mar. 2014.

\* cited by examiner

|  | Pair 1-2 | Pair 3-6 | Pair 4-5 | Pair 7-8 |
|---|---|---|---|---|
| 90W | 1mohm |  |  |  |
| 150W – 15M |  | 1mohm |  |  |
| 150W – 50M |  |  | 1mohm |  |
| 300W – 15M |  |  |  | 1mohm |
| 450W – 5m |  |  | 1mohm |  |
| TBD | 1mohm | 1mohm |  |  |
| TBD | 1mohm |  |  |  |

VERIFICATION OF CABLE APPLICATION AND REDUCED LOAD CABLE REMOVAL IN POWER OVER COMMUNICATIONS SYSTEMS

STATEMENT OF RELATED APPLICATION

The present application is a divisional of U.S. patent application Ser. No. 16/020,917 entitled "VERIFICATION OF CABLE APPLICATION AND REDUCED LOAD CABLE REMOVAL IN POWER OVER COMMUNICATIONS SYSTEMS", filed on Jun. 27, 2018, which claims priority from U.S. Provisional Application No. 62/641,183, entitled VERIFICATION OF CABLE APPLICATION IN POWER DISTRIBUTION OVER COMMUNICATIONS CABLING, filed on Mar. 9, 2018. The contents of these applications are incorporated herein by reference in their entirety. The present application is also related to U.S. patent application Ser. No. 16/355,051 entitled "VERIFICATION OF CABLE APPLICATION AND REDUCED LOAD CABLE REMOVAL IN POWER OVER COMMUNICATIONS SYSTEMS", filed on Mar. 15, 2019.

TECHNICAL FIELD

The present disclosure relates generally to communications networks, and more particularly, to use of rated cable systems and online removal of cables in power over communications systems.

BACKGROUND

Power over Ethernet (PoE) is a technology for providing electrical power over a wired telecommunications network from power sourcing equipment (PSE) to a powered device (PD) over a link section. Conventional PoE systems that use 90 W or less power sources are intended for safe operation with cable systems using common connector systems. With power over communications systems that exceed 100 W, it is important to verify operation of a cable for higher power PoE applications.

BRIEF DESCRIPTION OF THE DRAWINGS

Corresponding reference characters indicate corresponding parts throughout the several views of the drawings.

DESCRIPTION OF EXAMPLE EMBODIMENTS

Overview

In one embodiment, a method generally comprises identifying insertion of a plug at a port of power sourcing equipment for delivery of Power over Ethernet, the plug connected to one end of a cable with another plug connected to an opposite end of the cable, checking for resistors at each of the plugs, determining a power rating of the cable based on the resistors located at the plugs, and powering the port to a power level based on the power rating.

In another embodiment, an apparatus generally comprises a cable for transmitting power at a level exceeding 100 watts and data from power sourcing equipment to a powered device and plugs at each end of the cable, each of the plugs comprising at least one resistor. Power capacity of the cable is identified at a port receiving one of the plugs based on the resistors.

In yet another embodiment, an apparatus generally comprises a port for receiving a plug connected to one end of a cable with another plug connected to an opposite end of the cable for use in a Power over Ethernet system delivering power at a level exceeding 100 watts, an online removal button on a face of the port for use in indicating an intent to remove the plug from the port, and an online removal module for detecting activation of the online removal button and reducing power on the cable to at least 90 watts to prevent damage during removal of the cable.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Conventional PoE (Power over Ethernet) (e.g., 90 W and less) is intended for safe operation over 22 AWG (American Wire Gauge) to 26 AWG cable systems using common RJ45 connector systems. The maximum power delivery capacity of standardized PoE is approximately 90 watts (W), but many classes of powered devices would benefit from power delivery of greater than 100 W. Conventional PoE systems do not provide for cable distinction that would verify operation of a cable for higher than 90 W applications. For PoE applications exceeding 100 W, there is a need to verify compliance of cable and connector systems. For example, in higher power systems, such as those using 300 W PoE power supply equipment, different cable and connector systems and methods for testing compatibility of the cable and connector are needed.

Another issue with higher power PoE systems operating at power levels over 100 W is the current at the connector during removal of a cable. The PoE jack may operate, for example, with a per pin ampacity that can go from 500 ma to 2000 ma nominal. If the plug is removed from the jack while under load significant damage may occur at the connector.

The embodiments described herein provide for the use of rated cable systems in applications using power at a level higher than used in conventional managed PoE applications (e.g., greater than 90 W). One or more embodiments provide an apparatus, system, or method for identifying that the correct cable/connector assembly is used for delivered power on the PoE port. In one or more embodiments, the delivered power may be adjusted to a lower level appropriate for the cable system if the port is unable to identify the maximum operating parameters for the cable/connector assembly. In another embodiment, a reduced load cable removal apparatus and method provide termination of current to allow for safe removal of the cable and plug from a powered jack.

Figure 1:
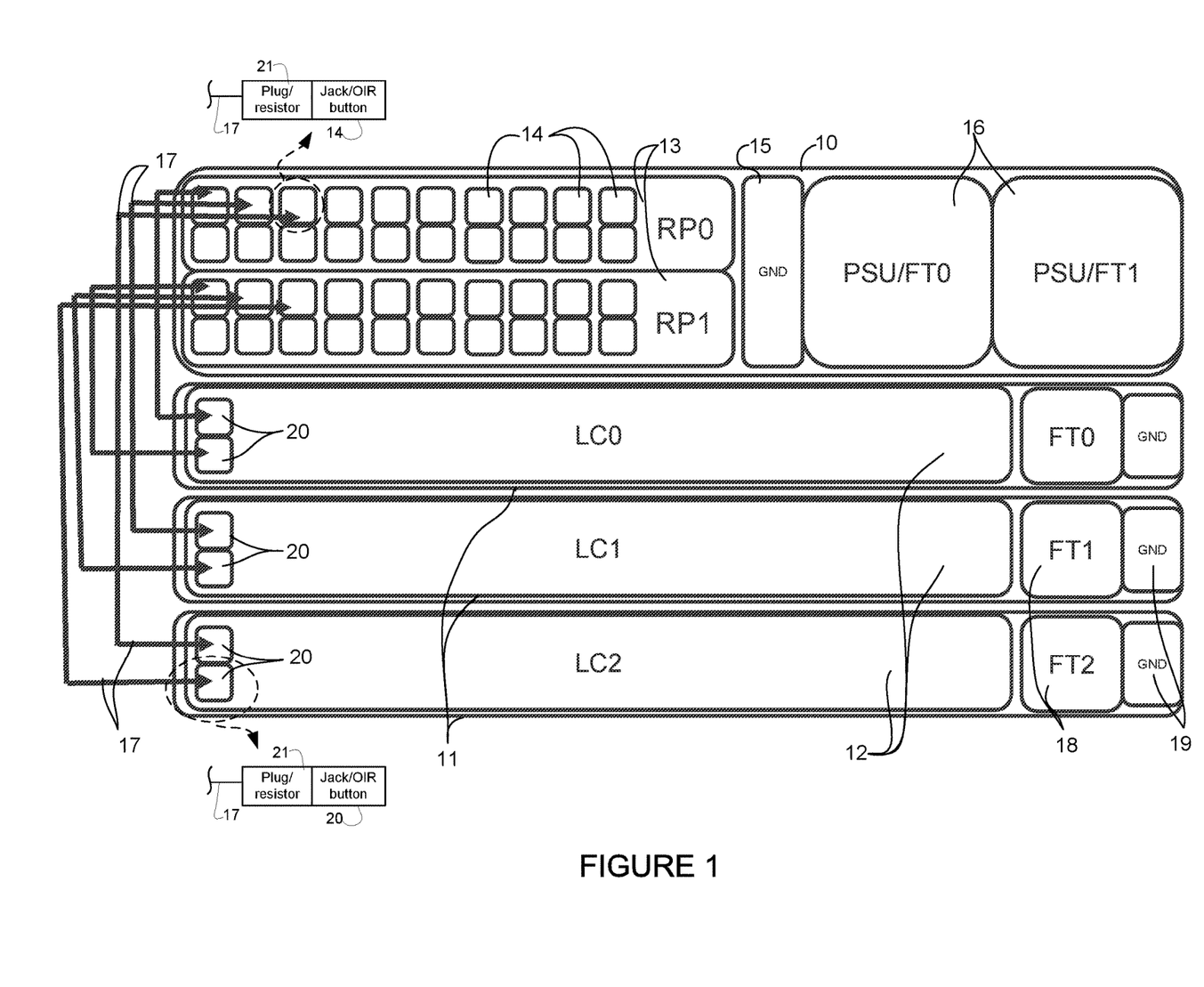
FIG. 1 illustrates an example of a system in which embodiments described herein may be implemented.

Referring now to the drawings, and first to FIG. 1, an example of a modular transport system that may utilize power over communications cabling (also referred to herein as enhanced PoE) for power distribution at higher power levels (e.g., ≥100 watts) is shown. The modular transport system shown in FIG. 1 includes a dual route processor (RP) card chassis 10 supplying control and power to three line card chassis 11. The dual RP card chassis may be, for example, a two RU (rack unit) chassis. The route processor card chassis 10 comprises two route processors 13 (RP0, RP1), each comprising twenty downlink ports 14, a dual port ground system 15, and two combination power supply unit (PSU) and fan tray modules 16 (PSU/FT0, PSU/FT1). The scalable transport system may support, for example, up to twenty redundant line card connections or eighteen line card connections and two fabric connections. Each downlink port 14 may support, for example, integrated 1 Gb/s or 10 Gb/s with a 300 W power system. The downlink ports 14 supply control (data) and power to each line card chassis 11 (or fabric chassis).

In one example, the power supply units 16 provide dual 2 kW AC or DC (or other power level) redundant power modules (1+1). Each line card chassis 11 comprises a line card 12 (LC0, LC1, LC2) comprising, fan tray 18 (FT0, FT1, FT2), a ground system 19, and dual uplink ports 20. Power and data are transmitted from ports 14 at the route processors 13 to the ports 20 at the line cards 12 via cables 17. In this example, the route processor 13 operates as the PSE (Power Sourcing Equipment) and the line cards 12 are the PDs (Powered Devices) in the PoE distribution system.

In one embodiment, the ports 14, 20 comprise interconnect ports that combine data and PoE utilizing an RJ45 (or similar connector). For example, the cable and connector system may comprise RJ45 cat7 style, four-pair communications cabling. The ports (jacks) 14, 20 may be labeled to identify capability for power exceeding 90 W. In one example, the cable and connector system may support ampacity per pin or wire to 2000 ma minimum. For example, 22 AWG wire may be used to support 1500 ma-2000 ma per wire in a cat7/cat5e cable system. In one example, the system may support a cable length of up to 15 meters (based on technology of cat7 cable, 22 AWG at 300 W). In one or more embodiments, the internal PSE power supply voltage may operate in the 56V to 57V range, 57V to 58V range, or 56V to 58V range. For example, the output voltage at the PSE may be 57V with an input voltage at the PD of 56V. For a 15 meter cable, a 56V power supply at the PSE can deliver approximately 300 W power.

The terms high power or higher power mode or setting as used herein refer to power exceeding 90 watts (e.g., ≥100 W, 150 W, 300 W, 450 W) and the terms lower power or low power mode or setting as used herein refer to power ≤90 watts.

The PSE (e.g., route processors 13 or any routing device (e.g., network device (router, switch) operable to route, switch, or forward data) may be in communication with any number of PDs (e.g., line card 12, fabric card, or other optics card) via cables 17. The PSE 13 may be configured to deliver power at one or more output levels (e.g., programmable PoE).

The cables 17 are configured to transmit both power and data from the PSE 13 to the PDs 12. The cables 17 may be formed from any material suitable to carry both power and data. The cables 17 may comprise, for example Catx cable (e.g., category 5 twisted pair (e.g., four-pair) Ethernet cabling) or any other type of cable. The cables 17 may be arranged in any configuration. The cable 17 may be rated for one or more power levels, a maximum power level, a maximum temperature, or identified according to one or more categories indicating acceptable power level usage, for example. In one example, the cables 17 correspond to a standardized wire gauge system such as AWG (American Wire Gauge).

In order to support cable systems operating above and beyond 100 W systems, an RJ45 connector (e.g., modified RJ45 or similar connector) at ports 14 and 20 are integrated with a resistor network that identifies cable systems specifically designed for 150 W, 300 W, 450 W (or other power level), and greater power, including lengths from 5 meters up to about 50 meters (or other suitable lengths), as appropriate for a defined cable system. As shown in the expanded view of the connector at ports 14, 20 in FIG. 1 and described in detail below, each connector may include a jack (port) 14, 20 mated to a plug 21 comprising one or more resistors. A cable system comprises the cable 17 with the plug 21 at each end comprising one or more resistors. Defined resistor settings may be used to identify that a cable system is acceptable for a particular level of power. In the case of a mismatch, the system is prohibited from operating above 90 W (or other low power limit).

As described further below with respect to FIG. 3, one or more resistors may be integrated into the plug side of the connector and a monitoring circuit placed on a jack side of the connector. The resistor may be a built in resistor or resistor cap for the connector on the cable side for auto detection, for example. Available amperage to the wires is determined by the resistor settings in the plug, as described below with respect to FIG. 4. The system insures that the appropriate cable wire ampacity and plug combination is correctly sized for the power application desired. If the system does not detect a resistor at both ends of the cable 17 or a mismatch is found between resistors, power at the PSE 13 may be adjusted to a lower power setting to prevent damage to the cable/connector system.

In one or more embodiments, an OIR (Online Insertion and Removal) button (also referred to as an online removal button) may be integrated into the connector system (jack 14, 20) to prevent unintended cable removal before lowering the current, as well as to prevent arcing on the connector system during extraction under power. As described below with respect to FIGS. 6A-6C, the OIR system provides for graceful software shutdown at the powered device and a means to disable (or reduce) current flow on the wires to prevent arcing and other forms of electrical disruption to the connector system.

It is to be understood that the PoE system shown in FIG. 1 is only an example, and other arrangements (e.g., number of route processors 13, PSUs 16, line cards 12, or downlink/uplink ports 14, 20) may be used without departing from the scope of the embodiments. Furthermore, the connectors (jacks, plugs), cables, cable lengths, and power ranges described herein are only examples and other types of connectors, lengths of cable, type of cable systems, or power levels may be used without departing from the scope of the embodiments.

Figure 2:
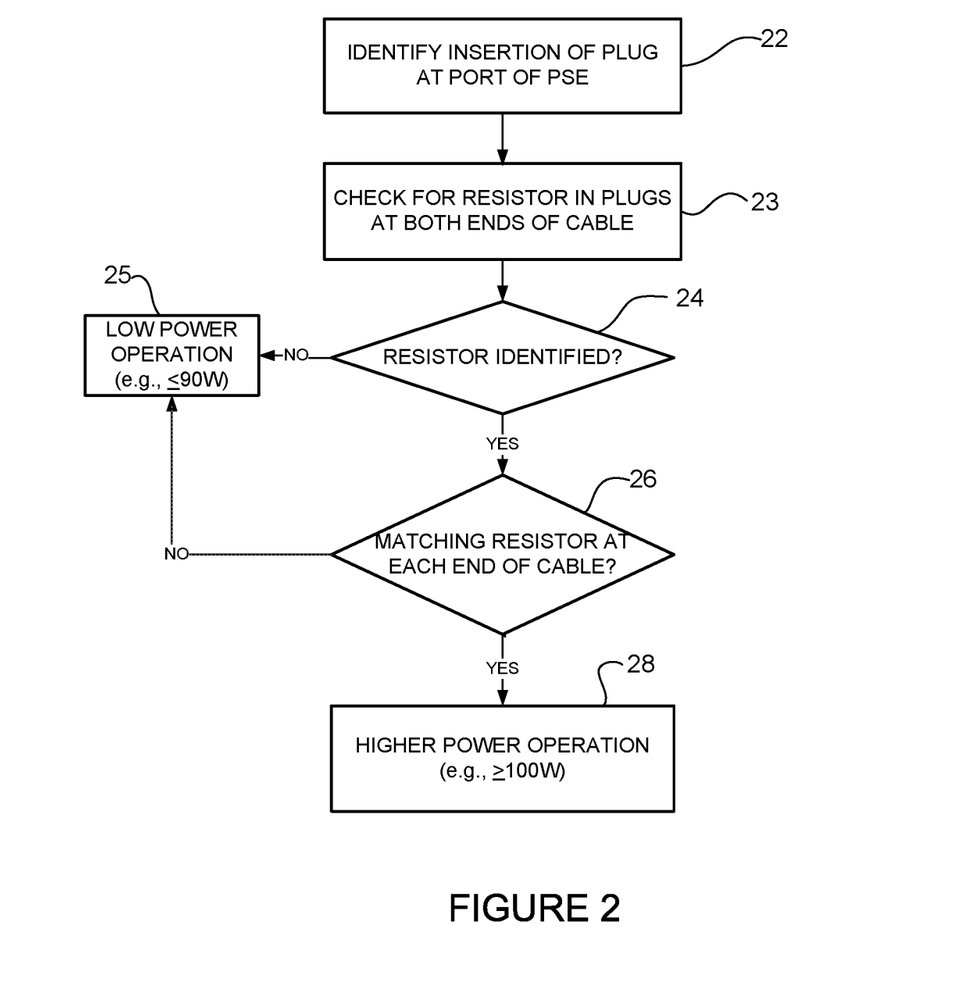
FIG. 2 is a flowchart illustrating an overview of a process for verification of cable application in a power over communications system, in accordance with one embodiment.

FIG. 2 is a flowchart illustrating an overview of a process for verification of cable application in power over communications systems, in accordance with one embodiment. As previously noted, resistors are integrated into a plug portion of a connector attached to each end of a cable and a monitoring circuit is placed on the jack side of the connector, with available amperage to the wires determined by the resistor settings in the plug. At step 22, the monitoring circuit identifies insertion of the plug at a port of the PSE (e.g., plug 21 attached to cable 17 received in mating jack 20 at port 14 of the PSE 13 in FIG. 1). The system checks for the presence of a resistor at the plugs at each end of the cable (step 23). If no resistor is found across any pair, the connector and cable system is assumed to handle only low power operation (e.g., 90 W maximum) (steps 24 and 25). The system only operates in low power operation and high power operation is blocked.

When matching resistors are detected at each end of the cable on at least one of the four pairs, the cable system may be identified as configured to handle higher power operation (e.g., ≥100 W) (steps 26 and 28). If only one of the two resistors in a pair is detected or a resistor pairing mismatch occurs, the cable system is assumed to handle only low power operation (e.g., 90 W maximum) (steps 26 and 25).

As described below with respect to FIG. 4, a specific power level or a specific power level for a specified length of cable may be indicated by the number of resistors or locations of resistors within the plugs (ends of cable). For example, a single matched pair of resistors may indicate different power levels based on the pair of wires on which the resistor is connected. In another example, when two or more matching resistors in each end of the cable are detected across the four pairs, the cable system is assumed to handle xxx Watts (wherein xxx depends on the wire gauge of the cable). For example, for a 22 AWG cable, xxx may be 600 W and the cable has a resistor network setting specific for that gauge wire, for 24 AWG cable, xxx may be 300 W and the cable has a resistor network setting for that gauge wire. This allows for future cable ampacity beyond the intended 300 W. It also allows for an intermediary power delivery of 150 W systems, or another optimal power level. Resistors may also be connected across different pairs to provide more setting variables.

It is to be understood that the process shown in FIG. 2 and described above is only an example and that steps may be combined, added, removed, reordered, or modified without departing from the scope of the embodiments. Also, it is to be understood that the resistor configurations and power levels described above are only examples.

Figure 3:
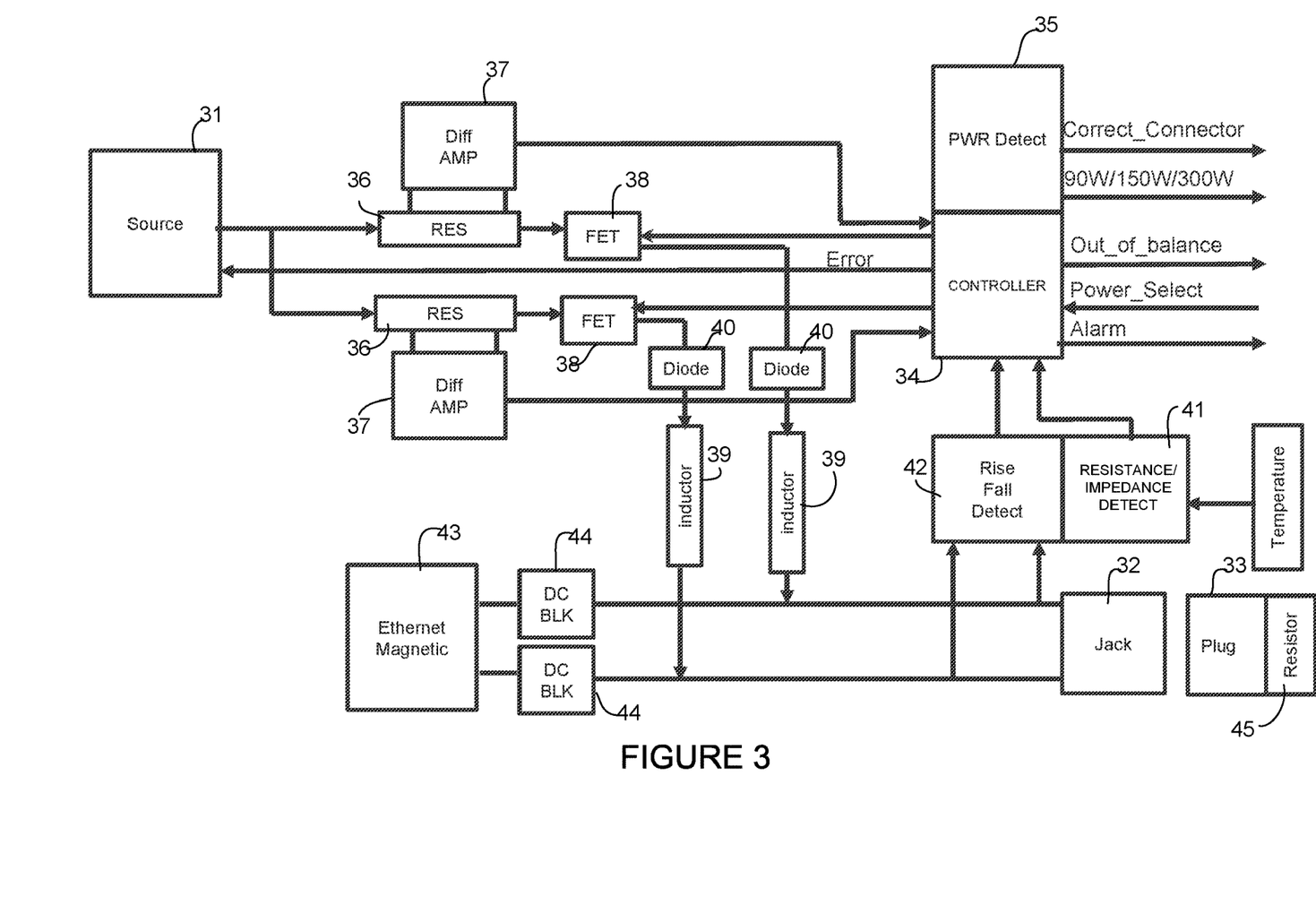
FIG. 3 is a block diagram of a circuit for use in cable and connector automatic compliance verification, in accordance with one embodiment.

FIG. 3 illustrates an example of a circuit for use in higher power PoE cable/connector auto compliance verification, in accordance with one embodiment. As previously described, the circuit performs resistor detection to determine cable capability, for each pair of wires at a port. For simplification, the circuit is shown for only one of the four pairs of wires at one of the ports. The circuit shown in FIG. 3 also includes optional fault detection components to check for pair-to-pair imbalance or other faults. The circuit shown in FIG. 3 operates between power source 31 and a connector (jack 32, plug 33) at the port. The source 31 may provide, for example, 58 VDC or other suitable power level, as previously described. The connector may comprise, for example, an RJ45 (or similar) connector for providing power and data over a cable to the powered device (e.g., line card 12 in FIG. 1).

A microcontroller 34 (e.g., PIC (Programmable Interface Controller)) may be used to compare all four pairs and provide an indication of an out of balance condition or fault and initiate an alarm. A power detection module 35 checks the resistors at each end of the cable, identifies the power capability of the cable system, and determines if the correct connector is installed. The controller 34 and power detector may determine the proper power output level (e.g., 90 W, 150 W, 300 W, or other suitable power level) and directs the source 31 to operate at an appropriate power level based on the capability of the cable system. The power detection module 35 may also perform one or more functions of the online removal module described below with respect to FIGS. 5, 6B, and 6C.

Power passes from the source 31 through resistors 36, which are in communication with differential amplifiers 37. The circuit includes field effect transistors (FETs) 38 receiving input from the source 31 (via the resistors 36) and the controller 34, and providing input to inductors 39 through inline diodes 40. The inductors 39 may define, for example, a transformer with a single input provided to both inductors. The controller 34 also receives input from a rise and fall detector 42 tapped into Ethernet lines. The Ethernet circuit includes Ethernet magnetics 43 and DC blocks 44. Temperature of the cable (wires, pair of wires) may also be provided to the controller 34 via detector 41 for additional fault detection. The temperature may be calculated in each wire, each pair of wires, the four-pair cable, or any combination. Thermal modeling of the cable may be performed as described in U.S. patent application Ser. No. 15/604,344, entitled "Thermal Modeling for Cables Transmitting Data and Power", filed May 24, 2017, for use in fault detection, for example.

The power detect module 35 (e.g., circuits, components) or one or more components of the power detection system may also be located at the jack 32.

In order to avoid the use of large magnetics to handle both data and power, the system may use passive coupling instead of integrated magnetics for data transfer. For example, the system may use AC coupling rather than passing through the Ethernet magnetics 43. This avoids the use of large magnetics to handle both data and power. Capacitors may be used to block the DC power from the Ethernet magnetics to prevent a short. In one example, capacitors are used inline and inductors are used to deliver power with matched power inductors.

It is to be understood that the circuit show in FIG. 3 and described above is only an example and other components or arrangement of components may be used to provide cable capability detection, fault detection, or power management, without departing from the scope of the embodiments.

Figure 4:
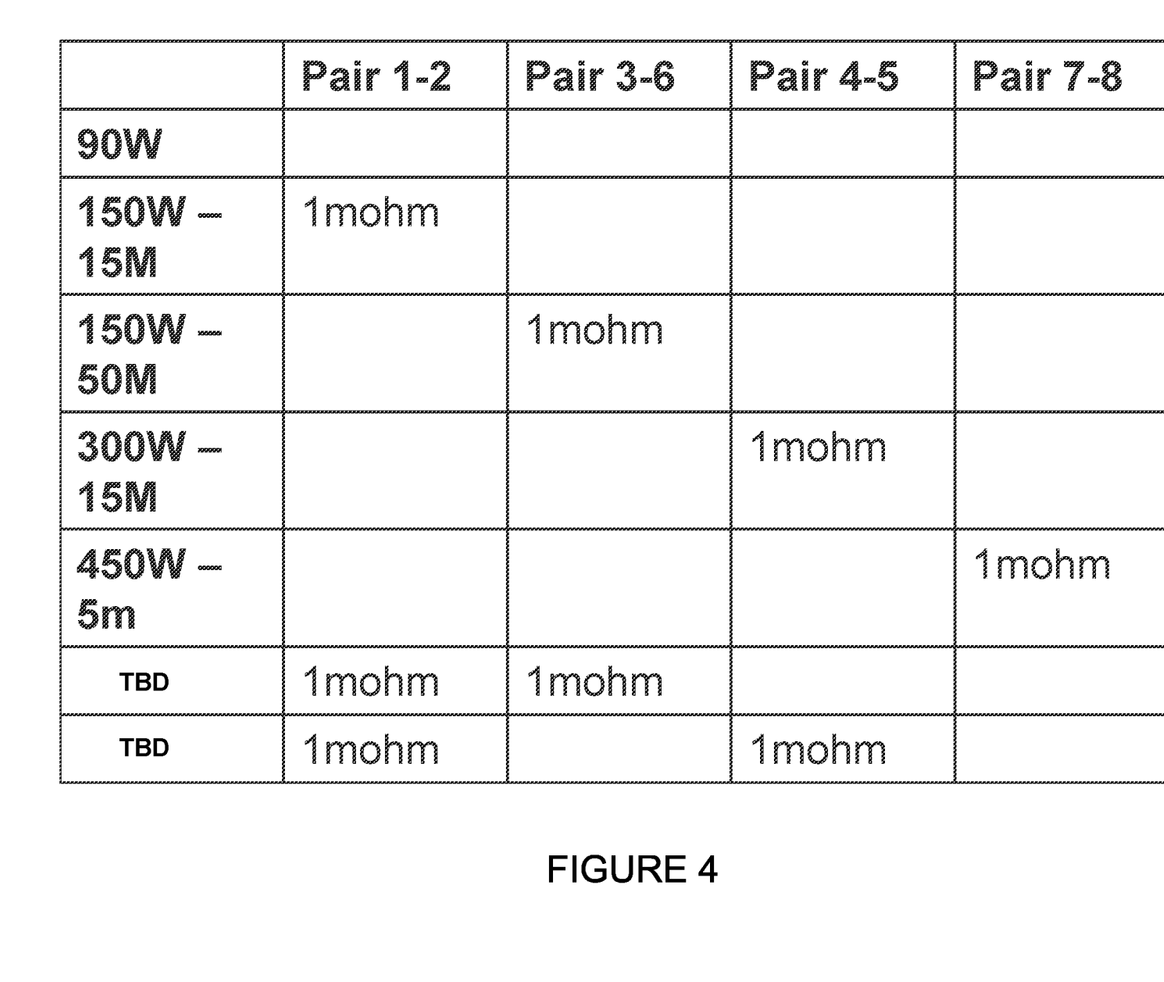
FIG. 4 is a table listing examples of resistor combinations that may be used to indicate cable power compatibility, in accordance with one embodiment.

FIG. 4 is a table illustrating an example of a cable/connector auto compliance verification system, in accordance with one embodiment. The resistor detection system may be connected across any, some, or all of the four pairs of wires. In order to create more fields in the resistor matrix, resistors may also cross pairs (e.g., wires 1 and 3, wires 5 and 6, etc.). This allows for several other variables in custom cable solutions. In the example shown in the table of FIG. 4, a 1 mohm resistor is used in the same pairing position on each connector plug of the cable (both ends of the cable). In one example, the network may be terminated across different pairs to indicate available power distribution. Resistors may also be located in more than one pair to indicate additional cable performance parameters (e.g., other power levels (TBD (to be decided)). A pulse train detection method may be used at a first interconnect to determine cable type.

The resistor system in the plug at each end of the cable may be used in several ways, in addition to providing the ampacity of the plug and cable for a specific application. For example, temperature rating, data rating, and length may be incorporated into the resistor matrix to indicate other factors to the control system for use in determining when an error has occurred. If a temperature is measured beyond the rating of the cable, an error may be generated.

The higher power PoE system may operate at a current level that may cause damage (e.g., pitting, high temperature, surface alterations) if the plug is removed from the jack while under load. At power exceeding 100 W on the PoE jack, the per pin ampacity may go from 500 ma nominal to 2000 ma nominal, which is a significant amount of current to disconnect. If the plug is removed from the jack while under full load significant damage may occur at the connector, with more damage occurring with each removal under load. This may cause the plug/jack connector system to be destroyed after ten disconnects, for example.

If a safety monitoring system operating within a 10 ms loop, for example, monitors the integrity of each wire, current to all connector pins will be turned off by the 11 ms point in the safety loop scanning through all 8 wires. During removal of the connector system, as soon as one wire is detected to be removed, all current is set to off. In this method, relying on the safety function to terminate current in the connector system, the pins in the connector system have basic protection, but may not be guaranteed protection from damage. As described below, an online removal button (e.g., mechanical plunger, switch, touch button) may be used to provide no-load (or reduced load) cable removal.

Figure 5:
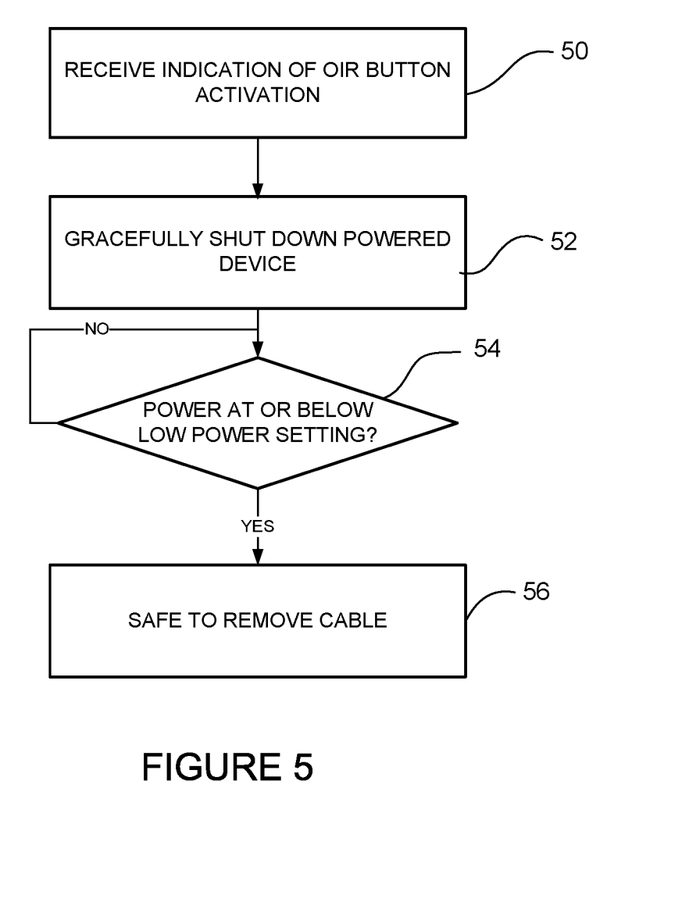
FIG. 5 is a flowchart illustrating an overview of a process for online removal of a cable from the power over communications system, in accordance with one embodiment.

FIG. 5 is a flowchart illustrating an overview of a process for reduced load cable removal, in accordance with one embodiment. In one or more embodiments, an OIR momentary button is placed in the RJ45 connector system (as shown below in FIG. 6B). The button is pressed when a user wants to remove a cable and an indication of OIR activation is received at an OIR module (online removal module) at the network device (e.g., route processor 13 in FIG. 1) (step 50). Software and/or hardware monitor activation of the button and alert the powered device via Ethernet packets on the cable to gracefully shut down (step 52). When the current monitors in the PSE detect that all pairs have base level power (e.g., ≤90 W, low power setting, reduced current), it is safe to remove the cable (steps 54 and 56). The corresponding port at the PSE may be shut down. Also, LEDs (described below) flashing or solid during the time after which the OIR button is pressed may move to an off state to indicate that it is safe to remove the cable. Maintenance personnel may then remove the cable without any damage to the connector. The OIR button may be pressed at either end of the cable (e.g., jack at PSE port or jack at PD port).

It is to be understood that the flowchart shown in FIG. 5 and described above is only an example and that steps may be modified or added, without departing from the scope of the embodiments.

Figure 6A:
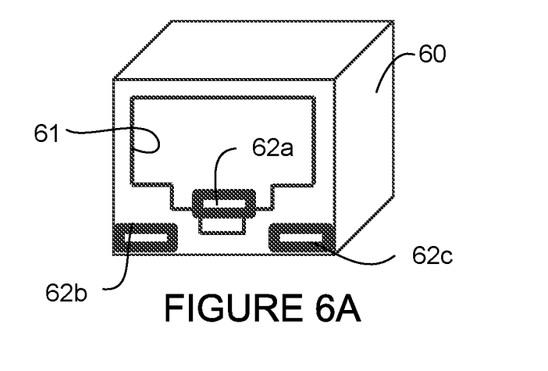
FIG. 6A illustrates an example of a jack for providing status indication of cable compatibility, in accordance with one embodiment.
Figure 6B:
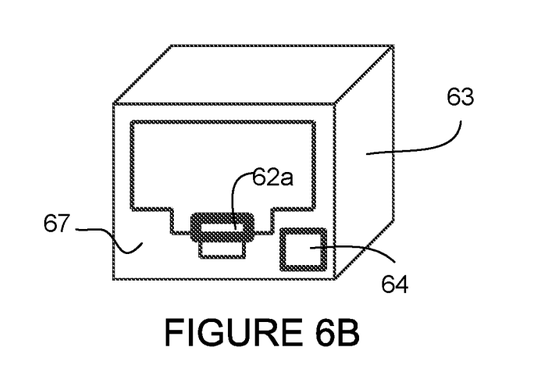
FIG. 6B illustrates the jack of FIG. 6A with an online removal button, in accordance with one embodiment.
Figure 6C:
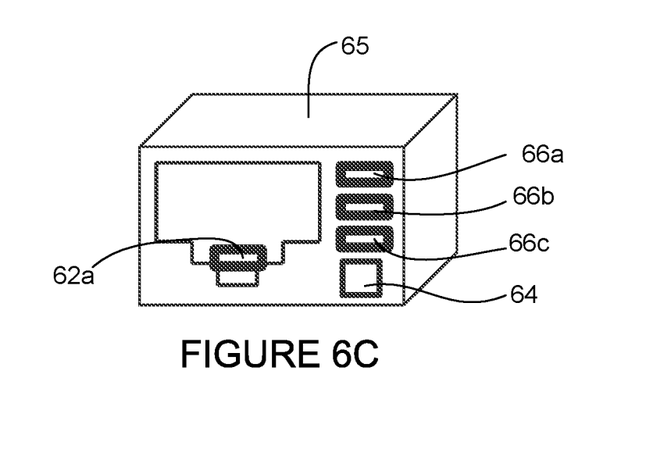
FIG. 6C illustrates a jack comprising additional status indicators, in accordance with one embodiment.

FIGS. 6A, 6B, and 6C illustrate examples of an OIR system that provides for indication of cable power compatibility and/or reduced load cable removal, in accordance with one or more embodiments. FIG. 6A shows an RJ45 type jack 60 comprising an opening 61 for receiving a plug connected to a cable. The jack 60 comprises three LED (Light-Emitting Diode) indicators 62a, 62b, and 62c (e.g., red, green, yellow). The red LED illuminates when the cable system is unable to support the maximum per wire ampacity. For example, if a cable system is inserted into the jack 60 and based on its resistors (e.g., mismatch, missing a resistor at one plug, no resistors) the cable system is not capable of delivering higher power PoE (e.g., power level exceeding 90 W), the system illuminates the red LED 62a.

FIG. 6B shows an RJ45 type jack 63 comprising an additional OIR (online insertion and removal) momentary push button (switch) 64 along with indicator light 62a on a face 67 of the port. The online removal button 64 allows the user to indicate to system software the user's intent to remove a cable. As described above with respect to the flowchart of FIG. 5, the powered device is notified of the intent to remove power upon activation of the button 64. In one example, the LED 62a begins to flash and the powered device gracefully shuts down. Power is then disconnected, predicated on the current monitors showing that all pairs have base level power (e.g., 90 W or less). The LED indicator 62a is then turned off to indicate that it is safe to remove the cable (cable/plug assembly).

The online removal button 64 may comprise any type of mechanical button or switch that may be depressed or otherwise actuated, a touch sensitive button that provides activation of an electrical switch, or any other type of device that is selectable by a user to initiate transmittal of a signal to an online removal module operable to reduce power at a PSE port.

FIG. 6C illustrates a jack 65 configured with additional space to allow for test and LED indicators 66a, 66b, 66c. In one example, one LED lights up to indicate 90 W or less capability, another signifies 150 W or less capability, and another LED indicates 300 W or less capability. More LEDs may be added for wattage requirements above 300 W. Also, different combinations of LEDs may indicate other power levels. The additional size of the jack 65 allows for improved connector pin assemblies to dissipate ampacity to 3 amps per pin at temperatures to 90° C., for example.

It is to be understood that the jack configurations shown in FIGS. 6A-6C are only examples and that other configurations may be used without departing from the scope of the embodiments. For example, the jack may include any number of indicator lights with the online removal button 64 or just the online removal button with no indicator lights.

In one or more embodiments, the button (switch) 64 may be designed such that once depressed, it remains depressed until the cable is removed and then another cable or the same cable is re-inserted. The button 64 may then automatically move to its extended position, waiting for the next OIR of the cable. The button 64 may act as a locking mechanism that will retain the RJ45 plug and prevent it from being removed. In one example, a cable is not allowed to be removed under load conditions and without software/hardware functionality gracefully shutting down the port and the powered device.

It is to be understood that the connectors, cables, and power ranges described herein are only examples and that other types of connectors, plugs, jacks, cables, cable systems, or power levels may be used without departing from the scope of the embodiments.

The embodiments described herein operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT), Internet, intranet, or any other network).

Figure 7:
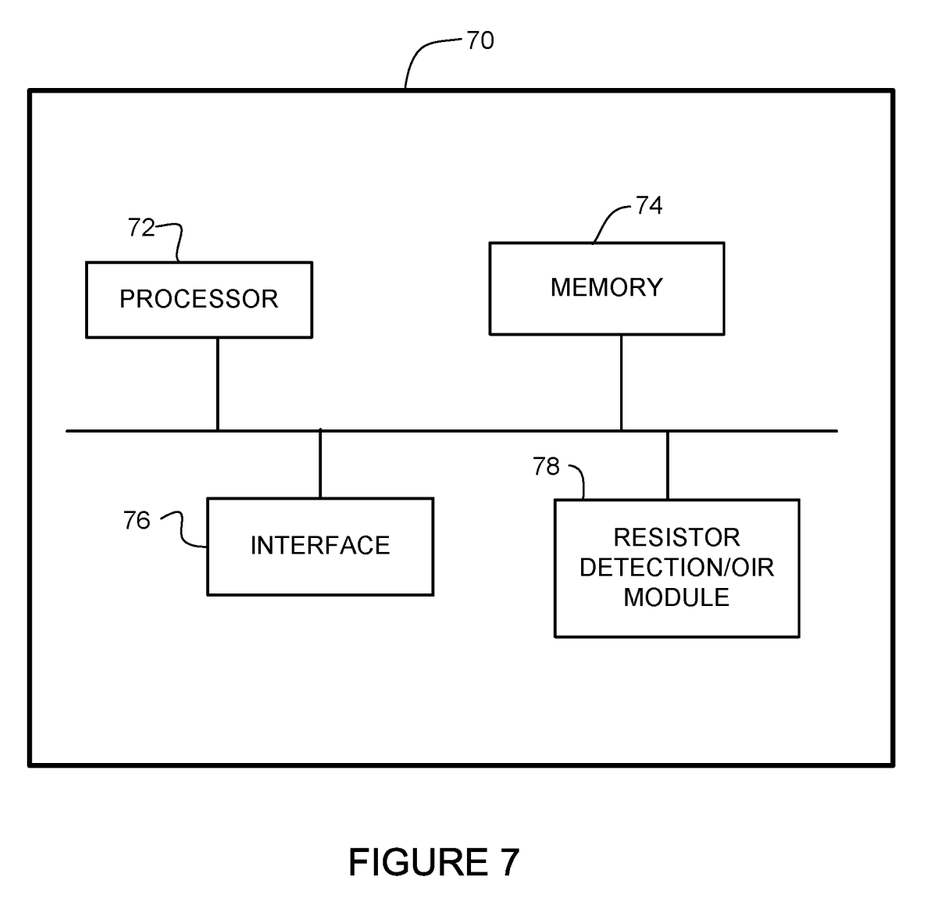
FIG. 7 depicts an example of a network device useful in implementing embodiments described herein.

FIG. 7 illustrates an example of a network device 70 (e.g., PSE, PD, transport system, route processor card chassis in FIG. 1) that may be used to implement the embodiments described herein. In one embodiment, the network device 70 is a programmable machine that may be implemented in hardware, software, or any combination thereof. The network device 70 includes one or more processors 72, memory 74, interface 76, and resistor detection/OIR module (online removal module) 78.

Memory 74 may be a volatile memory or non-volatile storage, which stores various applications, operating systems, modules, and data for execution and use by the processor 72. For example, components of the resistor detection/OIR module 78 (e.g., code, logic, or firmware, etc.) may be stored in the memory 74. The network device 70 may include any number of memory components.

The network device 70 may include any number of processors 72 (e.g., single or multi-processor computing device or system), which may communicate with a forwarding engine or packet forwarder operable to process a packet or packet header. The processor 72 may receive instructions from a software application or module, which causes the processor to perform functions of one or more embodiments described herein.

Logic may be encoded in one or more tangible media for execution by the processor 72. For example, the processor 72 may execute codes stored in a computer-readable medium such as memory 74. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described above with respect to the flowcharts of FIGS. 2 and 5, or other functions such as power level negotiations or safety subsystems described herein. The network device 70 may include any number of processors 72.

The interface 76 may comprise any number of interfaces or network interfaces (line cards, ports, connectors) for receiving data or power, or transmitting data or power to other devices. The network interface may be configured to transmit or receive data using a variety of different communications protocols and may include mechanical, electrical, and signaling circuitry for communicating data over physical links coupled to the network or wireless interfaces. For example, line cards may include port processors and port processor controllers. The interface 76 may be configured for PoE, enhanced PoE, PoE+, UPoE, or similar operation.

It is to be understood that the network device 70 shown in FIG. 7 and described above is only an example and that different configurations of network devices may be used. For example, the network device 70 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
   a port for receiving a plug connected to one end of a cable with another plug connected to an opposite end of the cable for use in a Power over Ethernet system delivering power at a level exceeding 100 watts;
   an online removal button on a face of the port for use in indicating an intent to remove the plug from the port; and
   an online removal module for detecting activation of the online removal button and reducing power on the cable to at least 90 watts to prevent damage during removal of the cable.

2. The apparatus of claim 1 wherein the online removal module initiates shutdown of a powered device upon detecting activation of the online removal button.

3. The apparatus of claim 2 wherein the online removal module is operable to transmit an Ethernet packet on the cable requesting the powered device to gracefully shut down.

4. The apparatus of claim 1 wherein each of the plugs comprises at least one resistor for use in identifying a power rating of the cable.

5. The apparatus of claim 1 wherein the port is located at power sourcing equipment or a powered device and the plug at the opposite end of the cable is inserted into the other of the power sourcing equipment and the powered device.

6. The apparatus of claim 1 wherein the port further comprises a light for indicating that power has been reduced and it is safe to remove the plug from the port.

7. The apparatus of claim 1 wherein the port comprises a plurality of lights indicating power capability.

8. The apparatus of claim 1 wherein the online removal module is operable to detect a reduced current in the cable and shut down the port at power sourcing equipment.

9. The apparatus of claim 1 wherein the online removal button comprises a locking mechanism to prevent removal of the plug until power is reduced to at least 90 watts.

10. A method comprising:
    receiving at a port, a plug connected to one end of a cable with another plug connected to an opposite end of the cable for use in a Power over Ethernet system delivering power at a level exceeding 100 watts;
    detecting at an online removal module, activation of an online removal button on a face of the port for use in indicating an intent to remove the plug from the port; and
    reducing power on the cable to at least 90 watts to prevent damage during removal of the cable.

11. The method of claim 10 further comprising initiating shutdown of a powered device upon detecting activation of the online removal button.

12. The method of claim 11 further comprising transmitting an Ethernet packet on the cable requesting the powered device to gracefully shut down.

13. The method of claim 10 wherein each of the plugs comprises at least one resistor for use in identifying a power rating of the cable.

14. The method of claim 10 wherein the port is located at power sourcing equipment or a powered device and the plug at the opposite end of the cable is inserted into the other of the power sourcing equipment and the powered device.

15. The method of claim 10 wherein the port further comprises a light for indicating that power has been reduced and it is safe to remove the plug from the port.

16. The method of claim 10 wherein the port comprises a plurality of lights indicating power capability.

17. The method of claim 10 wherein the online removal module is operable to detect a reduced current in the cable and shut down the port at power sourcing equipment.

18. The method of claim 10 wherein the online removal button comprises a locking mechanism to prevent removal of the plug until power is reduced to at least 90 watts.

19. One or more non-transitory computer-readable media including logic encoded therein and when executed operable to:
    detect activation of an online removal button on a face of a port for use in indicating an intent to remove a plug from the port, wherein the plug is connected to one end of a cable with another plug connected to an opposite end of the cable for use in a Power over Ethernet system delivering power at a level exceeding 100 watts; and
    reduce power on the cable to at least 90 watts to prevent damage during removal of the cable.

20. The non-transitory computer-readable media of claim 19 further operable to initiate shutdown of a powered device upon detecting activation of the online removal button.

* * * * *